(12) United States Patent
Ong et al.

(10) Patent No.: US 9,588,695 B2
(45) Date of Patent: Mar. 7, 2017

(54) MEMORY ACCESS BASES ON ERASE CYCLE TIME

(71) Applicant: Cypress Semiconductor Corporation, San Jose, CA (US)

(72) Inventors: Mee-Choo Ong, Penang (MY); Wei-Kent Ong, Penang (MY); Ogiwara Yuusuke, Tokyo (JP); Sie-Wei Henry Lau, Penang (MY)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 99 days.

(21) Appl. No.: 14/199,837

(22) Filed: Mar. 6, 2014

(65) Prior Publication Data

US 2015/0253988 A1    Sep. 10, 2015

(51) Int. Cl.
*G06F 12/00*     (2006.01)
*G06F 3/06*      (2006.01)

(52) U.S. Cl.
CPC ............ *G06F 3/061* (2013.01); *G06F 3/0659* (2013.01); *G06F 3/0688* (2013.01)

(58) Field of Classification Search
None
See application file for complete search history.

(56) References Cited

U.S. PATENT DOCUMENTS

| 7,715,239 | B2 | 5/2010 | Aritome |
| 2005/0094478 | A1* | 5/2005 | Hosono et al. ............... 365/232 |
| 2013/0135919 | A1* | 5/2013 | Hamada .................... G11C 7/14 365/148 |
| 2014/0269090 | A1* | 9/2014 | Flynn et al. ............. 365/185.19 |
| 2015/0078079 | A1* | 3/2015 | D'Abreu et al. ........ 365/185.03 |

* cited by examiner

*Primary Examiner* — Baboucarr Faal

(57) ABSTRACT

Disclosed herein are system, apparatus, article of manufacture, method and/or computer program product embodiments for improving a read margin in non-volatile semiconductor memory device. An embodiment includes measuring an erase-time of a memory block in a memory device and associating an indicator from the plurality of indicators for the memory block. The indicator is saved and later retrieved during a read operation.

20 Claims, 10 Drawing Sheets

|  | 1/5 Hybrid |  |  |  |  |  |  |  | 1/3 Hybrid |  |  |  |  |  |  |  |
| --- | --- | --- | --- | --- | --- | --- | --- | --- | --- | --- | --- | --- | --- | --- | --- | --- |
|  | BOL | EOL | | | | | | | BOL | EOL | | | | | | |
| P/E Cycles (k) | 0 | 10 | 10 | 100 | 100 | 100 | 100 | 100 | 0 | 10 | 10 | 100 | 100 | 100 | 100 | 100 |
| 125C DRB (hrs) | - | 12 | 100 | 1 | 5 | 12 | 24 | 50 | - | 12 | 100 | 1 | 5 | 12 | 24 | 50 |
| 55C Retent (yrs) |  | 2.4 | 20 | 0.2 | 1 | 2.4 | 4.8 | 10 |  | 2.4 | 20 | 0.2 | 1 | 2.4 | 4.8 | 10 |
| Low01 | 0 | 10.4 | 12.4 | 11.8 | 13.3 | 14.1 | 14.8 | 15.5 | 0 | 10.4 | 12.4 | 11.8 | 13.3 | 14.1 | 14.8 | 15.5 µA |
| Reference | 9.2 | 14.3 | 15.2 | 15.3 | 15.9 | 16.2 | *16.5* | *16.8* | 9.3 | 14.5 | 15.1 | 15.6 | 16.1 | 16.4 | *16.6* | *16.8* µA |
| High10 | 18 | 18 | 18 | 18 | 18 | 18 | 18 | 18 | 18 | 18 | 18 | 18 | 18 | 18 | 18 | 18 µA |
| Static | 10 | 15 | 15 | 17 | 17 | 17 | 17 | 17 | 10 | 15 | 15 | 17 | 17 | 17 | 17 | 17 µA |
|  | *Ref1* | *Ref2* | | *Ref3* | | | | | *Ref1* | *Ref2* | | *Ref3* | | | | |

MEMORY ACCESS BASES ON ERASE CYCLE TIME

BACKGROUND

Recent progress in electronic devices requires farther effort in developing higher reliability flash memory. Generally, a flash memory is a non-volatile semiconductor memory device (NVM) that can be electrically erased and reprogrammed. A flash memory has a finite number of program erase cycles, typically written as P/E cycles. Commercially available flash products from Beginning-Of-Life (BOL) to End-Of-Life (EOL) typically withstand around 80,000-100,000 P/E cycles before the wear begins to deteriorate the integrity of storage.

Wear-out management techniques are implemented to further extend the life of a flash memory. For example, in order to wear-level a device, a block-level interface is implemented to perform writes to a different cell block each time. Typically, a flash controller keeps count of P/E cycles for memory blocks and based on the number of P/E cycles, determines how to distribute a write to a different memory block with less P/E cycles. Typically, a flash controller keeps count of P/E cycles for memory blocks and based on the number of P/E cycles, determines how to distribute a write to a different memory block with less P/E cycles.

The counts of P/E cycles for each memory block is incremented with each erase cycle and is saved in a dedicated area of the flash memory. However, this requires a larger device size, and a large NVM storage area is needed to keep track of memory blocks. For example, to keep counts of 80,0000-100,000 P/E cycles, 17 bits are required. In addition, the storage area for the counts tends to also wear out faster as the erase count update happens at every erase operation.

SUMMARY

Provided herein are method, system, and computer program product embodiments, and/or combinations and sub-combinations thereof, for associating a memory indicator to a memory block representative of its status of use from the Beginning-Of-Life (BOL) to the End-Of-Life (EOL).

An embodiment includes a computer implemented method for setting and storing an indicator associated with a memory block in a latch and a non-volatile memory (NVM). The indicator is set from a plurality of indicators associated with a plurality of pre-defined threshold values. The erase-time of a memory block is compared with pre-defined threshold values and triggers setting an indicator for the memory block.

In an embodiment, indicators are loaded into a latch from an NVM during a Power on Reset (POR).

In an embodiment, the indicator associated with a memory block is retrieved during a read instruction. The indicator is evaluated to determine a proper reference cell for reading the memory. Selecting the reference cell improves the read margin from the BOL to the EOL.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which:

FIG. 9 shows performance results for ⅓ Hybrid and ⅕ Hybrid devices according to an embodiment.

In the drawings, like reference numbers generally indicate identical or similar elements. Additionally, generally, the left-most digit(s) of a reference number identifies the drawing in which the reference number first appears.

DETAILED DESCRIPTION

Memory System

Figure 1:
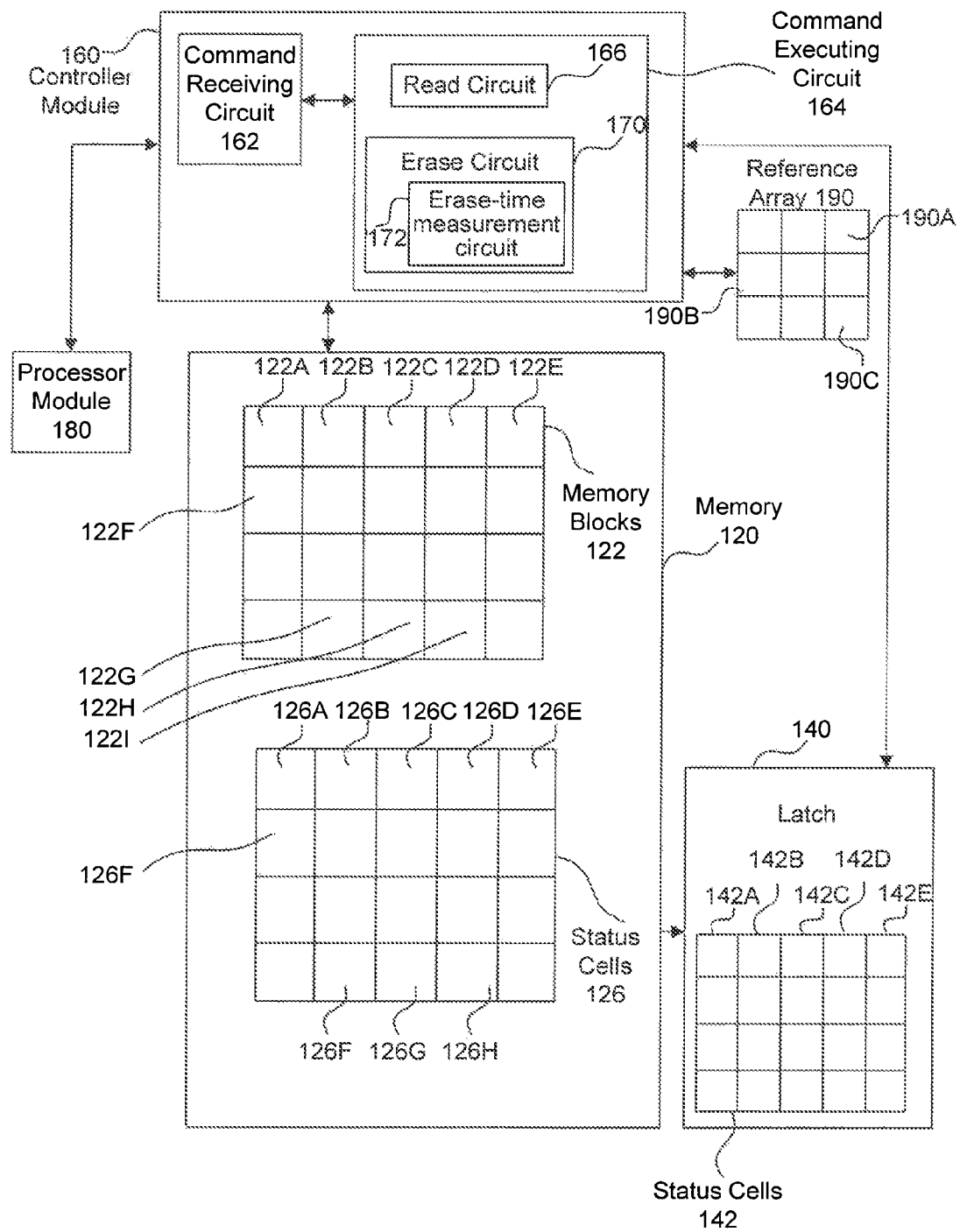
FIG. 1 is a block diagram of a memory system according to an embodiment.

FIG. 1 is a block diagram of a memory system 102 according to an exemplary embodiment. Memory system 102 can operate in for example a read, write, or erase mode of operation. In a read mode of operation, memory system 102 reads electronic data from one or more memory cells that are configured to form an array of memory cells, or simply memory. In a write mode of operation, memory system 102 writes electronic data to one or more memory cells. In an erase mode of operation, memory system 102 erases the contents of one or more memory cells. In an embodiment, the memory system 102 can be implemented as a volatile memory, such as random access memory (RAM) or read-only memory (ROM). The RAM can be implemented as dynamic random-access memory (DRAM), static random-access memory (SRAM), and/or non-volatile random-access memory (NVM), often referred to as a flash memory. The invention is not limited to these examples, but is instead applicable to other memory types. The memory system 102 includes a memory 120, a latch 140, a memory controller module 160, a processor module 180, and a reference array 190.

Memory 120 includes memory blocks 122 and status cells 126. While memory blocks 122 hold data, status cells 126 hold status information regarding memory blocks 122. For example, status cell 126A holds status information regarding memory block 122A and status cell 126D holds status information regarding memory block 122D. In an embodiment, the status information for a memory block 122 is equal to the total count of program erase (P/E) cycles for the memory block 122. Hence, for an example memory block 122A with 80,000-100,000 P/E cycles, status cell 126A with at least 17 bits of storage is required. In addition, in an embodiment, status cells 126 is updated with every P/E cycle, and a status cell 126 holding status information for a memory block 122 goes through the same number of P/E cycles as the memory block 122 itself. When memory block 122 becomes un-reliable and reaches the End-of-Life (EOL), the functionality of memory 126 holding the status information becomes un-reliable, as well. Accordingly, in an alternative embodiment, the counts for the P/E cycles are replaced with setting one or more indicators. As a result, the amount of storage needed in status cells 126 is reduced significantly. In addition, the reliability of status cells 126 holding status information is less of a concern.

In an embodiment, latch 140 includes status cells 142 that hold status information regarding memory blocks 122. For example, status cell 142A holds status information regarding memory block 122A and status cell 142D holds status information regarding memory block 122D. Status cells 142 are updated from status cells 126 during a Power-On-Reset (POR). For example, status cell 142A is updated from status cell 126A during a POR. In an embodiment, the status information for memory block 122 is equal to the total count of P/E cycles for the memory block 122. Hence, for an example memory block 122A with 80,000-100,000 P/E cycles, a status cell 142A with at least 17 bits of storage is required. In an embodiment, the total count for the P/E cycles is replaced with one or more indicators, therefore, the amount of storage in status cells 142 is reduced significantly.

Controller module 160 includes a command receiving circuit 162 and a command executing circuit 164. Command receiving circuit 162 receives and decodes instructions related to read, write, or an erase operation. Decoded instructions are routed to command executing circuit 164. A read instruction is routed to a read circuit 166, while erase instructions are routed to an erase circuit 170, respectively. Controller module 160 has access to both memory 120 and latch 140. For example, controller module 160, could access a memory block 122A and its status at 126A and 142A. Controller module 160, may command processor module 180 and a reference array 190 to perform a set of procedures.

Erase circuit 170 includes an erase-time measurement circuit 172. Erase-time measurement circuit 172, measures the erase-time of a memory block during a P/E cycle. The time it takes to erase a memory cell increases as the number of times the memory cell goes through P/E cycles increases. In an embodiment, one threshold value for the erase-time is selected. Therefore, when the measured erase-time is greater than the threshold value, the indicator associated with the memory block 122 is set in status cell 126. In another embodiment, multiple threshold values are selected. N number of threshold values would partition the erase-time to N+1 intervals. In an embodiment, in the first interval, where the erase-time is less the first threshold, no indicator is set in status cell 126. In the second interval, when the erase-time is greater than the first threshold but is less than the second threshold, a first indicator is set in status cell 126. Similarly, other indicators are set accordingly. In an embodiment, for memory systems 122 with more than one threshold value, only the latest indicator is saved in status cells 126 and 142. This application is not limited to any number of threshold values or the number of indicators.

Controller module 160 routes the measured erase-time to processor module 180. Processor module 180 has access to pre-defined threshold values. These threshold values are either saved in a local memory within the processor module 180 or are saved at external memory locations. Processor module 180 is configured to receive the erase time for memory block 122 from controller module 160. Processor module 180 compares the erase time with the threshold values. Processor module 180, based on pre-defined rules, determines whether or not to set an indicator for memory block 122. Determination can be based on simple rules, such as comparing the erase time with threshold values, or can be based on more complicated algorithms that take in other factors, such as other indicators saved in status cells 126 or status cells 142 associated with other memory blocks 122. If an indicator is set, controller module 160 stores the indicator associated with memory block 122 in status cells 142 and 126.

Read circuit 166 receives addresses for one or more memory blocks 122 to perform the read. The read operation is performed on memory blocks 122, where the contents of memory blocks 122 are read with an adjusted reference cell. The read circuit 166 has access to status cells 142, where it retrieves indicator values for the memory blocks for the read operation. During the read, controller module 160 selects the reference cell through a reference array 190. The reference cell is selected based on the indicator retrieved from status cells 142. Every indicator can be associated to a different reference cell. A default reference cell 190A is selected when no indicator is associated to memory block 122. Whereas, for memory block 122 with a first and a second indicators, memory cells 19B and 190C are selected, respectively. In one embodiment, reference cells 190A-C are associated with currents of 10 μA, 15 μA, and 17 μA, respectively. There is no limitations on the number of indicators, and thus, no limitations are imposed on the number of reference cells.

While memory blocks 122 and status cells 126 in memory 120 are shown in FIG. 1 as a single array, they can include any number of array blocks that maybe independently operable. Similarly, status cells 142 in latch 140 can also include any number of independently operable blocks. In addition, one or more instructions and related control signals may be provided to memory system 102 from an instruction decoder (not shown for simplicity) to control read and erase operations for memory system 102. Other well-known signals which can be provided to memory system 102, such as enable signals, clock signals, and power connections, are also not shown for simplicity.

Figure 2A:
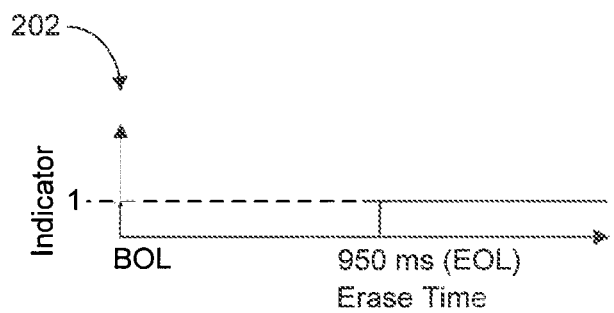
FIG. 2A is an illustrative example of selecting an indicator according to an embodiment.
Figure 2B:
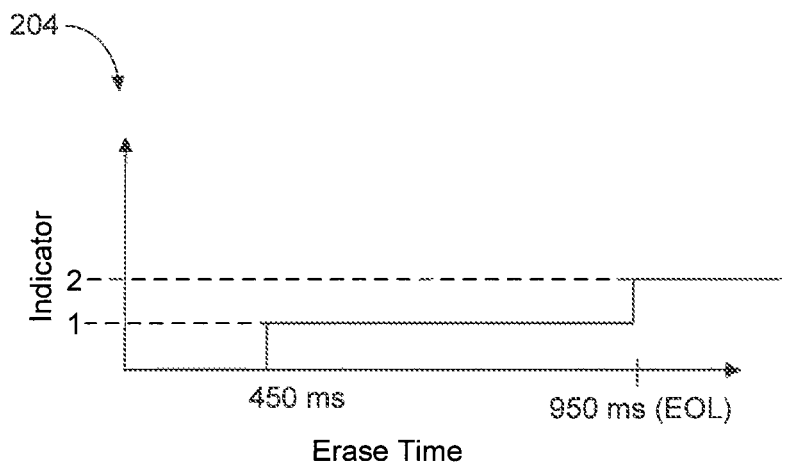
FIG. 2B is an illustrative example of selecting more than one indicator according to an embodiment.

FIGS. 2A and 2B are illustrations of embodiments for memory system 102, where processor module 180 is configured to compare the erase-time with pre-defined threshold values. Generally, the time it takes to erase a memory block 122 increases as the number of times the memory goes through P/E cycles increases. In an embodiment, one threshold value for the erase-time is selected. Therefore, when a measured erase-time is greater than the threshold value, the indicator associated with the memory block 122 is set. This is illustrated in FIG. 2A, where only one threshold value of 450 ms is defined for memory system 102. Subsequently, an indicator is set when the erase-time exceeds 450 ms. The indicator in the example of FIG. 2A, represents the EOL where memory block 122 has gone through 80,000 P/E cycles. Only one bit of memory 126 is needed to hold status information for memory block 122 and is only set once for the life of the device. Therefore, for a memory system 102 with 2048 memory blocks 122, only 2048 bits of storage is required. Also, this approach does not affect reliability, as status cell 126 is only updated once. In an embodiment, a total count of P/E cycles is saved. Hence, to keep count of 80,000 P/E cycles, 17 bits are required for each memory block 122 and the counts must be updated with every erase operation. This requires status cells 126 with 32,816 bits of memory storage to hold status information for a memory system 102 with 2048 memory blocks 122. In addition, the reliability of the status cells 126 maintaining the counts becomes a concern as the counts of P/E cycles approaches the EOL.

FIG. 2B illustrates an embodiment where two threshold values of 450 ms and 950 ms are defined for memory system 102. Subsequently, a first indicator is set when the erase-time exceeds the first threshold and a second indicator is set when the erase-time exceeds the second threshold. In this embodiment, the first indicator represents memory blocks with greater than 10,000 and less than 80,000 cycles, while the second indicator represents memory blocks with greater than 80,000 cycles. Memory system 102 with two indicators requires two bits of storage per memory block 122. Therefore, for a total of 2048 memory blocks 122, 4096 bits are required. This is much less than 32,816 bits that are needed to keep the total counts for all memory blocks assuming 80,000-100,000 P/E cycles to reach the EOL. In addition, setting the first and the second indicator requires only two P/E cycles, which does not negatively impact the reliability of the memory status cells. In an embodiment, more than two threshold values are designated. N number of threshold values would partition the erase-time to N+1 intervals and would result in N number of indicators. Note that for memory system 102 with more than one threshold values, the new indicator will be selected and old indicator will be ignored. This application is not limited to any number of threshold values or the number of indicators.

Figure 3:
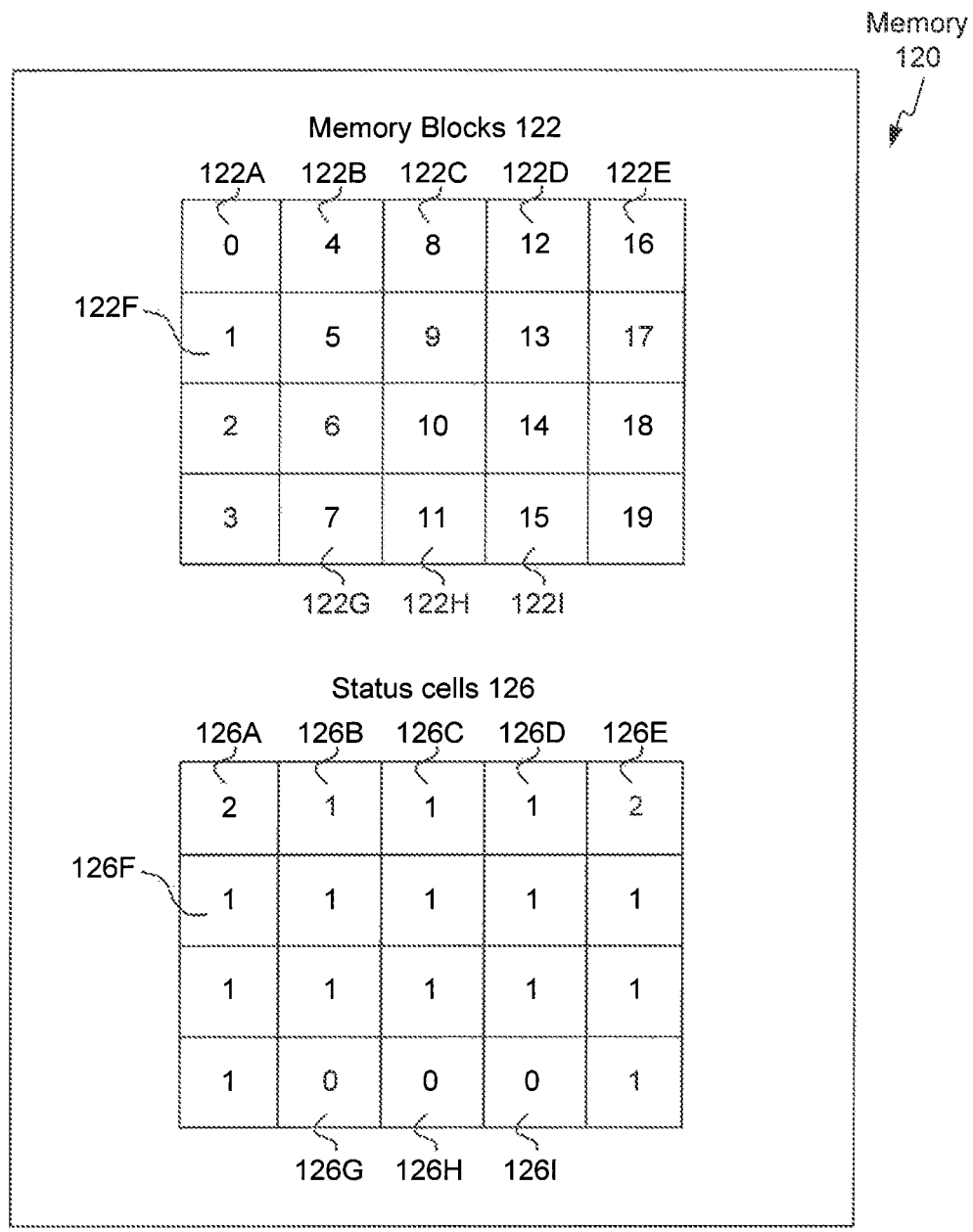
FIG. 3 is an illustrative example of status cells associated to memory blocks according to an embodiment.

FIG. 3 illustrates an exemplary memory 120 with memory blocks 122 mapped to status cells 126. The memory 120 has 20 memory blocks indexed from 0-19. The indicators associated for these memory block are saved in exemplary status cells 126. The indicators are either zero, one, or two. In an exemplary embodiment, zero is a default value for a memory block with an indicator that is not set, while one or two correspond to a first and a second threshold value, respectively. In this example, there are no indicators set for the memory blocks of 7, 11, and 15. This is illustrated by zeros in 126G, 126H, and 126I. However, memory blocks 122A and 122E are set to the second indicator as shown by setting 126A and 126E to '2'. All the other memory blocks are set to the first indicator, for example, 126B, 126C, 126D, and 126F are set to '1'. In an embodiment for a memory system with only two indicators, the second indicator represents a memory block that has reached the EOL, which typically is somewhere from 80,000 to 100,000 P/E cycles. In yet another embodiment, the second indicator represents memory block 122 associated with the farthest sectors or any other memory blocks with known issues or defects. Generally, the farthest sectors characteristically have read margin issues when compared to nearest sectors. Therefore, a manufacturer may set an indicator for a memory block by default.

Figure 4:
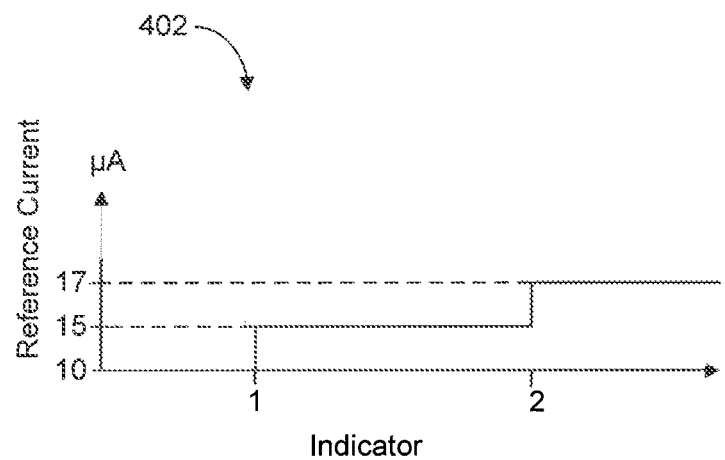
FIG. 4 is an illustrative example of associating an indicator to a reference cell according to an embodiment.

FIG. 4 illustrates selecting a reference cell for memory system 102 according to an exemplary embodiment. As memory block 122 is utilized, and approach its EOL, the read margin between a zero and a one gets narrower. In an embodiment, a different reference cells is selected based on read margin to improve the read operation. A reference cell is selected by a reference array 190 in response to the indicator associated with the memory block 122. For example, FIG. 4 illustrates selecting a reference cell based on the value of the two indicators for an exemplary device. In the example of FIG. 4, higher reference cells are used to improve the read operation for memory cells with indicators. For example, when an indicator is not set, reference cell 190A with 10 µA is used for the read operation. However, for an indicator of '1' and '2' reference cells 190B and 190C with 15 µA and 17 µA are used, respectively. In an embodiment, one or more indicators are used and are associated with one or more reference cells. The number of indicators and hence the number of reference cells are not limited to any particular values.

Erase Operation

Figure 5:
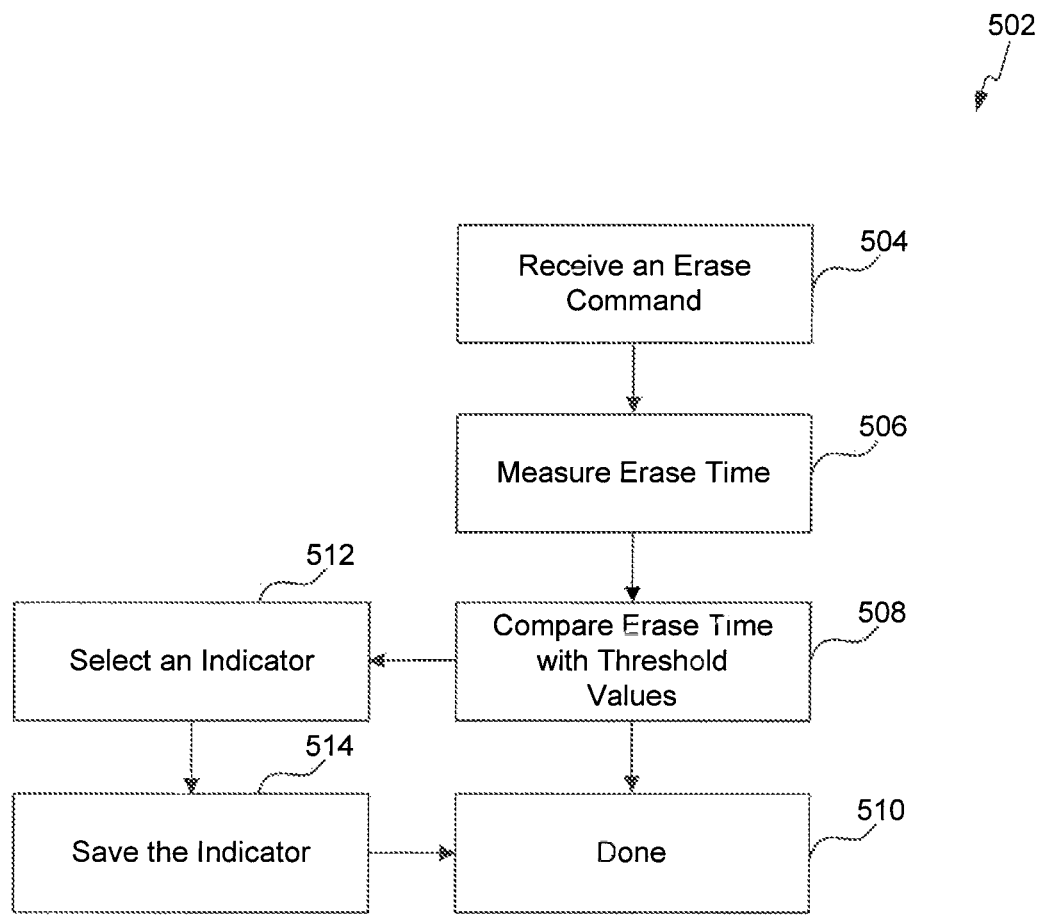
FIG. 5 is a flowchart illustrating steps performed by a memory system for executing an erase operation according to an embodiment.

FIG. 5 is a flowchart of a method 502 for processing an erase command according to an embodiment. The steps of method 502 can be performed using, for example, memory system 102 of FIG. 1.

In step 504, a controller module receives an erase command for an erase of a memory block. For example, command receiving circuit 162 is configured to receive instructions for an erase operation.

In step 506, the memory is erased and the time associated with the erase cycle is measured. For example, erase circuit 170 is configured to erase a memory block, such as 122C, and erase-time measurement circuit 172 is configured to measure the erase-time of the memory block.

In step 508, the measured erase-time is compared with one or more threshold value. For example, controller module 160 instructs processor module 180 to determine whether an indicator must be set for a memory block. Processor module 180 receives the measured erase-time from the controller module 160 and compares it with one or more threshold values.

Following the comparison, the process would either terminates in step 510 or would continue to 512. The process terminates when no indicator is selected. Otherwise, in step 512, an indicator is selected for a memory block. For example, processor module 180 may determine to set an indicator for a memory block after comparing the erase-time with one or more threshold values.

The selected indicator associated with the memory block is saved in step 514. The indicator is saved in both memory and latch. For example, a controller module 160 may save the indicator into status cells 126 and 142. Note that status cells 142 are updated from status cells 126 during POR.

Processing an erase command terminates at 510, following the step 514.

Read Operation

Figure 6:
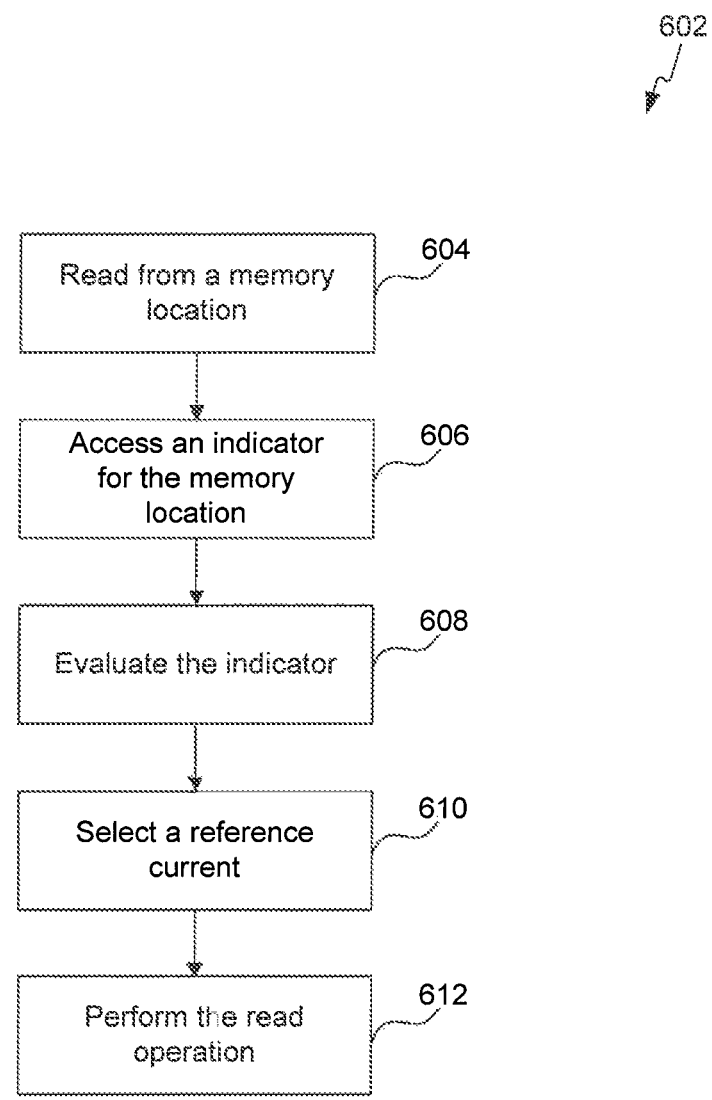
FIG. 6 is a flowchart illustrating steps performed by a memory system for executing a read operation according to an embodiment.

FIG. 6 is a flowchart of a method 602 for processing a read operation according to an embodiment. The steps of method 602 can be performed using, for example, memory system 102 of FIG. 1.

In step 604, a controller module receives a read command for a read operation, from a memory block. For example, command receiving circuit 162 is configured to receive instructions for a read operation from a memory block 122A.

In step 606, an indicator associated with a memory block is retrieved from a latch. For example, controller module 160 retrieves a status of a memory block from status cell 142A.

The value of the indicator is evaluated in step 608. For example, processor module 180 evaluates the indicator.

The process continues to step 610, where a reference cell is associated to the indicator. For example, a reference array 190 selects a reference cell based on the indicator. In an embodiment, reference cells with higher reference currents maybe selected for memory blocks 122 that are associated with higher indicators.

The memory block is read in step 612 with the selected reference cell of step 610.

Example Memory System

Figure 7:
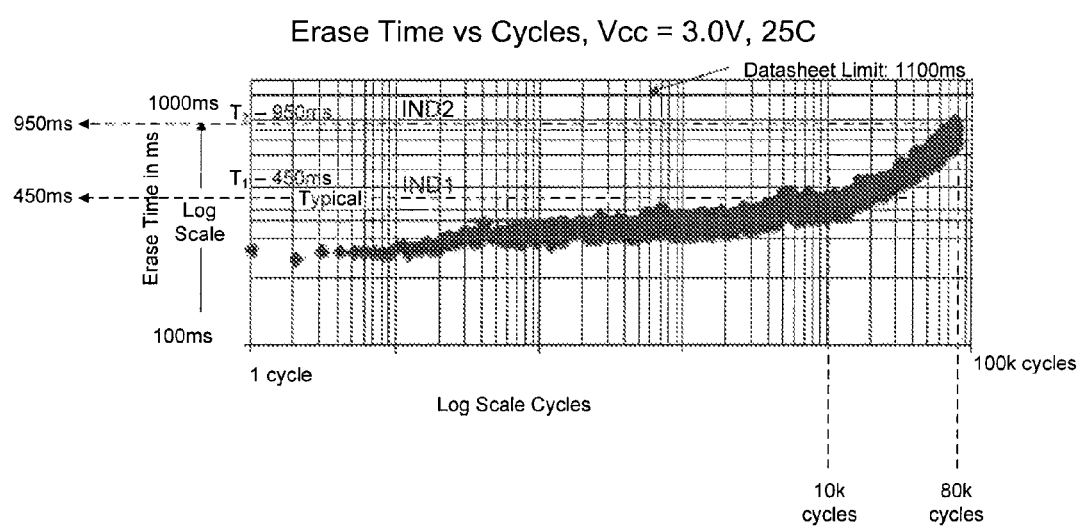
FIG. 7 shows performance results for an exemplary memory device illustrating erase-time versus P/E cycles according to an embodiment.

FIG. 7. Shows example performance results of erase-time versus P/E cycling for an exemplary memory block according to an embodiment. The X-axis represents the number of P/E cycles, which is displayed in log-scale. The Y-axis represents the erase-time, which is also displayed in log-scale. The time to erase a memory block (on the Y-axis) ranges from a lower limit of 100 ms to an upper limit of 1100 ms. Indicators 1 and 2 are set based on thresholds $T_1$=450 ms and $T_2$=950 ms. The first indicator is set when the time to erase a memory block exceeds 450 ms while the second indicator is set when the time to erase a memory block exceeds 950 ms. As illustrated on the figure, with no indicators being set, it is expected for a memory device to have gone through less than 10,000 P/E cycles. With the first indicator, it is expected for the memory to have gone through 10,000-80,000 P/E cycles. It is further expected for the memory to have gone through more than 80,000 P/E cycles, when the second indicator is set.

Figure 8:
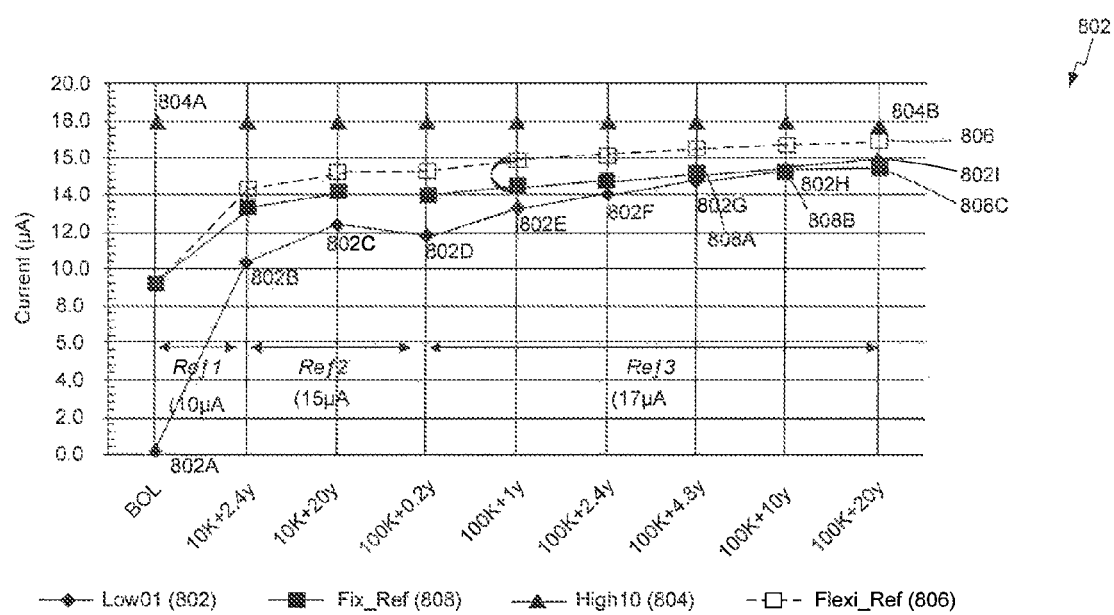
FIG. 8 shows performance results for an exemplary memory device with flexi reference according to an embodiment.

FIG. 8. shows the contribution of selecting a reference cell in extending the read margin across EOL for an exemplary memory device according to an embodiment. The results of reference cell selection based on two indicators are labeled as Flexi_Ref 806 and are compared against a fixed reference labeled as Fix_Ref 808. At the BOL, the Low margin 802 is substantially close to zero and the high margin 808 is at 18 μA. However, as the number of erase cycles increases the low margin approaches the high margin. The high margin is labeled as 804A to 804B, which is consistently fixed at 18 μA, whereas the low margin changes from 802A to 802I. For a read margin issue not to occur, the reference must be greater than [(the low margin 802)+1.5 μA] and less than [the high margin 804]. Therefore, the memory block with Fix_Ref 806 has EOL margin issues, as labeled by 808A-808C. However, there are no read margin issues observed for the Flexi_Ref 808.

FIG. 9 shows performance results for a read scheme with flexi reference cell selection for both a ⅓ Hybrid and a ⅕ Hybrid from BOL to EOL according to an embodiment. The results convey that the read margin issue at the EOL has been eliminated for both ⅓ Hybrid and ⅕ Hybrid.

Example Computer System

Figure 10:
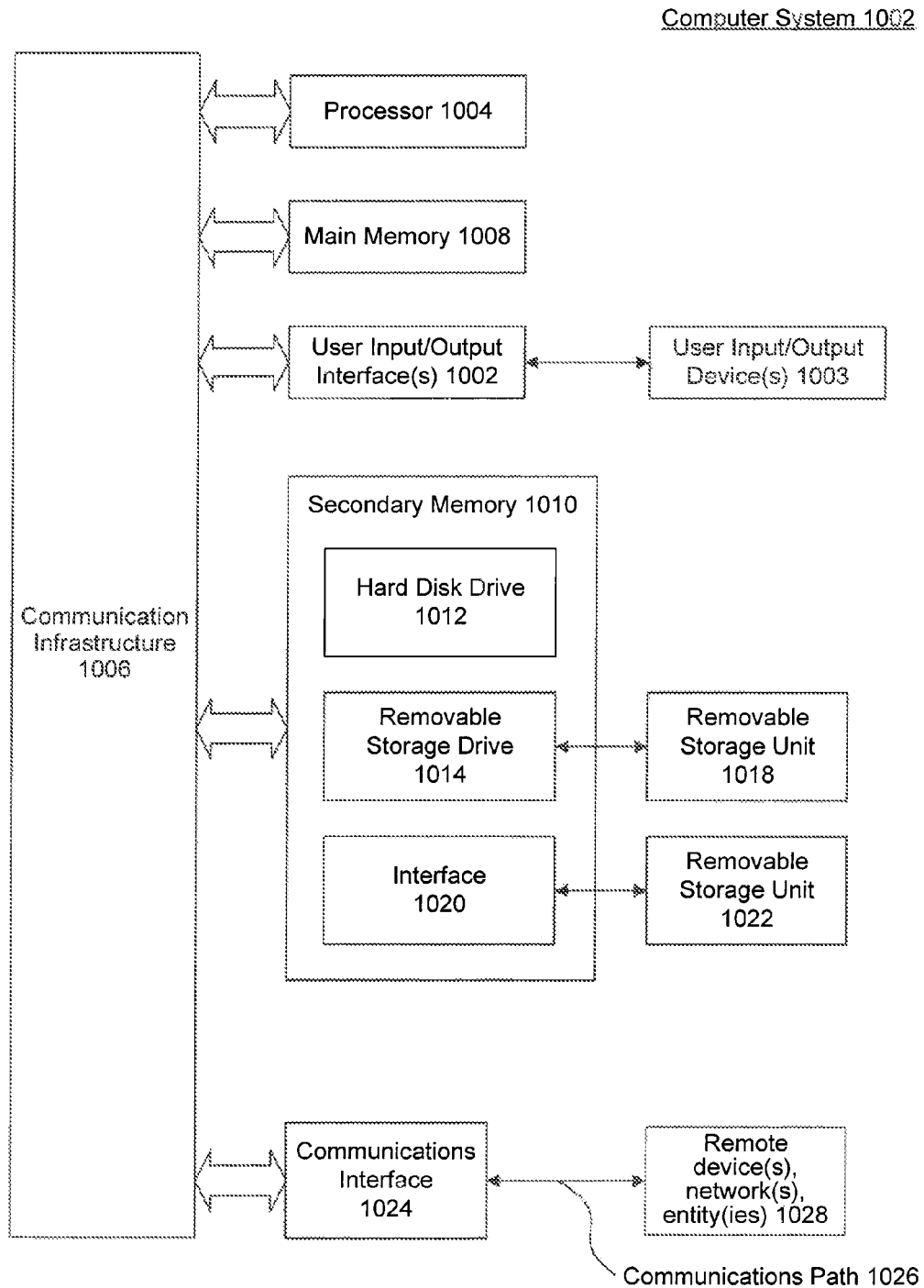
FIG. 10 is an example computer system useful for implementing various embodiments.

Various embodiments of the memory system 102 can be implemented, for example, using one or more well-known computer systems, such as computer system 1002 shown in FIG. 10. Computer system 1002 can be any well-known computer capable of performing the functions described herein, such as computers available from International Business Machines, Apple, Sun, HP, Dell, Sony, Toshiba, etc.

Computer system 1002 includes one or more processors (also called central processing units, or CPUs), such as a processor 1004. Processor 1004 is connected to a communication infrastructure or bus 1006.

One or more processors 1004 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1002 also includes user input/output device(s) 1003, such as monitors, keyboards, pointing devices, etc., which communicate with communication infrastructure 1006 through user input/output interface(s) 1002.

Computer system 1002 also includes a main or primary memory 1008, such as random access memory (RAM). Main memory 1008 may include one or more levels of cache. Main memory 1008 has stored therein control logic (i.e., computer software) and/or data.

Computer system 1002 may also include one or more secondary storage devices or memory 1010. Secondary memory 1010 may include, for example, a hard disk drive 1012 and/or a removable storage device or drive 1014. Removable storage drive 1014 may be a floppy disk drive, a magnetic tape drive, a compact disk drive, an optical storage device, tape backup device, and/or any other storage device/drive.

Removable storage drive 1014 may interact with a removable storage unit 1018. Removable storage unit 1018 includes a computer usable or readable storage device having stored thereon computer software (control logic) and/or data. Removable storage unit 1018 may be a floppy disk, magnetic tape, compact disk, DVD, optical storage disk, and/any other computer data storage device. Removable storage drive 1014 reads from and/or writes to removable storage unit 1018 in a well-known manner.

According to an exemplary embodiment, secondary memory 1010 may include other means, instrumentalities or other approaches for allowing computer programs and/or other instructions and/or data to be accessed by computer system 1002. Such means, instrumentalities or other approaches may include, for example, a removable storage unit 1022 and an interface 1020. Examples of the removable storage unit 1022 and the interface 1020 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1002 may further include a communication or network interface 1024. Communication interface 1024 enables computer system 1002 to communicate and interact with any combination of remote devices, remote networks, remote entities, etc. (individually and collectively referenced by reference number 1028). For example, communication interface 1024 may allow computer system 1002 to communicate with remote devices 1028 over communications path 1026, which may be wired and/or wireless, and which may include any combination of LANs, WANs, the Internet, etc. Control logic and/or data may be transmitted to and from computer system 1002 via communication path 1026.

In an embodiment, a tangible apparatus or article of manufacture comprising a tangible computer useable or readable medium having control logic (software) stored thereon is also referred to herein as a computer program product or program storage device. This includes, but is not limited to, computer system 1002, main memory 1008, secondary memory 1010, and removable storage units 1018 and 1022, as well as tangible articles of manufacture embodying any combination of the foregoing. Such control logic, when executed by one or more data processing devices (such as computer system 1002), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 10. In particular, embodiments may operate with software, hardware, and/or operating system implementations other than those described herein.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method, comprising:
   measuring an erase-time of a memory block in a memory device;
   comparing the erase-time with a threshold value;
   storing at least one indicator for the memory block, a value of the at least one indicator being based on the comparing;
   selecting a reference cell from a plurality of reference cells based on the value of the indicator; and
   reading data from the memory block with the selected reference cell.

2. The method of claim 1, wherein the at least one indicator is set to a first value when the erase-time of the memory block exceeds the threshold value, and is set to a second value when the erase-time of the memory block is less than the threshold value.

3. The method of claim 1, wherein a plurality of indicators are set based on a plurality of threshold values.

4. The method of claim 1, wherein the storing comprises storing the at least one indicator in a non-volatile memory.

5. The method of claim 4, further comprising loading the at least one indicator from the non-volatile memory to a latch during a Power-On-Reset (POR).

6. The method of claim 1, further comprising storing the at least one indicator in a latch.

7. A method, comprising:
   receiving a command to read data from a memory block;
   accessing an indicator associated with the memory block, wherein the indicator is stored in a status cell within a volatile memory, the status cell being associated with the memory block;
   selecting a reference cell from a plurality of reference cells based on a value of the indicator; and
   reading the data with the selected reference cell.

8. The method of claim 7, wherein the selecting comprises:
   selecting a first reference cell if the indicator is a first value, and selecting a second reference cell if the indicator is a second value.

9. The method of claim 8, wherein the indicator has a first value if an erase-time of the memory block was previously determined to be less than a threshold, and wherein the indicator has a second value if the erase-time of the memory block was previously determined to be greater than the threshold.

10. The method of claim 7, wherein each of the plurality of reference cells is associated with a different current value.

11. The method of claim 7, further comprising loading the indicator from a non-volatile memory to a latch during a POR.

12. A memory device, comprising:
   measuring circuitry configured to measure an erase-time of a memory block in a memory device;
   a processing module configured to compare the erase-time with a threshold value; and
   a controller module configured to:
      store an indicator for the memory block, a value of the indicator being based on the comparing, and
      select a reference cell from a plurality of reference cells based on the value of the indicator; and
      read data from the memory block with the selected reference cell.

13. The memory device of claim 12, wherein the indicator is set to a first value when the erase-time of the memory block exceeds the threshold value, and is set to a second value when the erase-time of the memory block is less than the threshold value.

14. The memory device of claim 12, wherein the indicator is set based on a plurality of threshold values.

15. The memory device of claim 12, wherein the controller module is configured to store the indicator in a non-volatile memory.

16. The memory device of claim 15, wherein the controller module is further configured to load the indicator from the non-volatile memory to a latch during a POR.

17. The memory device of claim 12, wherein the controller module is configured to store the indicator in a latch.

18. The memory device of claim 17, wherein the controller module is further configured to map the indicator saved in the latch to a reference cell different from an original reference cell.

19. The method of claim 1, wherein each of the plurality of reference cells is associated with a different current value.

20. The memory device of claim 12, wherein each of the plurality of reference cells is associated with a different current value.

* * * * *